(12) United States Patent
Hirano et al.

(10) Patent No.: US 9,162,251 B2
(45) Date of Patent: Oct. 20, 2015

(54) LAMINATION AND METHOD FOR MANUFACTURING LAMINATION

(75) Inventors: Satoshi Hirano, Kanagawa (JP); Yuichiro Yamauchi, Kanagawa (JP); Masaru Akabayashi, Kanagawa (JP); Toshihiko Hanamachi, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 14/009,420

(22) PCT Filed: Apr. 6, 2012

(86) PCT No.: PCT/JP2012/059590
§ 371 (c)(1),
(2), (4) Date: Oct. 2, 2013

(87) PCT Pub. No.: WO2012/137950
PCT Pub. Date: Oct. 11, 2012

(65) Prior Publication Data
US 2014/0023875 A1   Jan. 23, 2014

(30) Foreign Application Priority Data
Apr. 6, 2011 (JP) .................................. 2011-084763

(51) Int. Cl.
*B05D 1/12* (2006.01)
*C23C 24/04* (2006.01)
*C23C 28/02* (2006.01)
(Continued)

(52) U.S. Cl.
CPC ................ *B05D 1/12* (2013.01); *B05B 7/1486* (2013.01); *B05D 1/36* (2013.01); *B32B 15/01* (2013.01); *B32B 15/16* (2013.01); *C23C 14/025* (2013.01); *C23C 14/16* (2013.01); *C23C 24/04* (2013.01); *C23C 28/021* (2013.01); *C23C 28/023* (2013.01); *C23C 28/42* (2013.01); *B22F 2007/042* (2013.01); *Y10T 428/12076* (2015.01)

(58) Field of Classification Search
None
See application file for complete search history.

(56) References Cited

U.S. PATENT DOCUMENTS

| 6,592,947 | B1 | 7/2003 | McCane et al. |
| 2005/0031876 | A1 | 2/2005 | Lu et al. |

(Continued)

FOREIGN PATENT DOCUMENTS

| CN | 1416964 A | 5/2003 |
| CN | 1782127 A | 6/2006 |

(Continued)

OTHER PUBLICATIONS

Sobolev, V. V. Guilemany, J. M. Nutting, J. (2004). High Velocity Oxy-Fuel Spraying—Theory, Structure-Property Relationships and Applications. Maney Publishing for IOM3, the Institute of Materials, Minerals and Mining, Part 2.0-2.6.*

(Continued)

*Primary Examiner* — Mark Ruthkosky
*Assistant Examiner* — Daniel J. Schleis
(74) *Attorney, Agent, or Firm* — Locke Lord LLP

(57) ABSTRACT

A lamination includes a substrate formed of a metal or alloy, an intermediate layer formed on a surface of the substrate and is formed of a metal or alloy that is softer than the substrate, and a metal film deposited by accelerating a powder material of a metal or alloy together with a gas heated to a temperature lower than the melting point of the powder material and spraying it onto the intermediate layer while keeping it in a solid phase.

6 Claims, 3 Drawing Sheets

(51) Int. Cl.
  *B32B 15/01* (2006.01)
  *B05B 7/14* (2006.01)
  *B05D 1/36* (2006.01)
  *B32B 15/16* (2006.01)
  *C23C 14/02* (2006.01)
  *C23C 14/16* (2006.01)
  *C23C 28/00* (2006.01)
  *B22F 7/04* (2006.01)

(56) References Cited

U.S. PATENT DOCUMENTS

| | | |
|---|---|---|
| 2006/0093888 A1 | 5/2006 | Vyas et al. |
| 2006/0121187 A1 | 6/2006 | Haynes et al. |
| 2006/0134321 A1 | 6/2006 | DeBiccari et al. |
| 2007/0153965 A1 | 7/2007 | Choi et al. |
| 2007/0240603 A1 | 10/2007 | Ko et al. |
| 2011/0272826 A1* | 11/2011 | Holst et al. ............ 257/782 |
| 2012/0148769 A1* | 6/2012 | Bunker et al. ............ 428/34.1 |

FOREIGN PATENT DOCUMENTS

| | | |
|---|---|---|
| CN | 1793422 A | 6/2006 |
| CN | 1989080 A | 6/2007 |
| CN | 101063204 A | 10/2007 |
| EP | 2690195 A1 | 1/2014 |
| JP | 2002-226230 A | 8/2002 |
| JP | 2003-301279 A | 10/2003 |
| JP | 2008-127676 A | 6/2008 |
| JP | 2008-231486 A | 10/2008 |
| JP | 2008-302317 A | 12/2008 |
| JP | 2009-197294 A | 9/2009 |
| JP | 2009197294 * | 9/2009 |
| WO | WO-2006063468 A1 | 6/2006 |

OTHER PUBLICATIONS

International Search Report dated Jun. 19, 2012, issued for PCT/JP2012/059590.
The extended European search report dated Nov. 13, 2014 issued for corresponding European Patent Application No. 12768423.1.
Chinese Office Action dated Oct. 8, 2014 issued for corresponding Chinese Patent Application No. 201280016240.X.

* cited by examiner

LAMINATION AND METHOD FOR MANUFACTURING LAMINATION

FIELD

The present invention relates to a lamination and a method for manufacturing a lamination.

BACKGROUND

In recent years, as one of the thermal spray methods, the cold spray method has received attention that sprays material powder at high temperature and high velocity onto a substrate, thereby depositing the material powder to coat the substrate. In the cold spray method, the material to be a film is sprayed together with an inert gas heated to a temperature of not more than the melting point or softening point of the material powder through a convergent-divergent (Laval) nozzle to impinge on the substrate while remaining in a solid phase, thereby forming the film on a surface of the substrate. This produces a metal film free of phase transformation and with reduced oxidization.

Conventionally, as the cold spray method, a technique is disclosed in which a substrate is temperature-controlled to a predetermined temperature to be sprayed with material powder (for example, see Patent Literature 1), and another technique is disclosed in which a substrate and/or an inert gas is temperature-controlled to form a metal film (for example, Patent Literature 2).

CITATION LIST

Patent Literature

Patent Literature 1: Japanese Patent Application Laid-open No. 2008-302317
Patent Literature 2: Japanese Patent Application Laid-open No. 2008-127676

SUMMARY

Technical Problem

Although Patent Literature 1 recites that the adhesion efficiency of the material powder can be increased by heating a substrate to a temperature of not more than the melting point (absolute temperature) of the material powder, preferably a temperature about half the melting point (absolute temperature), it does not demonstrate explicitly how much adhesion of the material powder can be increased by the substrate heating. It does not describe any relation between the substrate heating and adhesion strength between the metal film formed by the method and the substrate.

Although Patent Literature 2 recites that a film formation rate increases in a case where copper powder is sprayed while the temperature of a stainless substrate is being heated to 373 K to 673 K and in a case where copper powder is sprayed with a helium gas heated to 673 K without heating applied to the stainless substrate, it does not describe any relation between the above cases and adhesion strength between the metal film formed by the method and the substrate.

The present invention has been achieved in view of the above circumstances, and an object thereof is to provide, in manufacturing a lamination in which a metal film is formed on a metal substrate using the cold spray method, a lamination having high adhesion strength between the metal substrate and the metal film and a method for manufacturing the lamination.

Solution to Problem

To solve the problem described above and achieve the object, a lamination according to the present invention includes: a substrate formed of a metal or alloy; an intermediate layer formed on a surface of the substrate and formed of a metal or alloy that is softer than the substrate; and a metal film deposited on a surface of the intermediate layer by accelerating a powder material of a metal or alloy together with a gas heated to a temperature lower than a melting point of the powder material and spraying the powder material onto the intermediate layer while keeping the powder material in a solid phase.

Moreover, in the above-described lamination according to the present invention, the substrate is formed of stainless steel, and the intermediate layer is formed of any one metal selected from silver, gold, aluminum, copper, tin, lead, and zinc.

Moreover, in the above-described lamination according to the present invention, the metal film is formed of the same material as the intermediate layer.

Moreover, in the above-described lamination according to the present invention, the intermediate layer has a thickness of 0.05 μm to 10 μm.

Moreover, in the above-described lamination according to the present invention, the intermediate layer is formed by sputtering.

Moreover, in the above-described lamination according to the present invention, the metal film is deposited on the surface of the intermediate layer while the substrate on which the intermediate layer is formed is being heated.

Moreover, a method for manufacturing a lamination according to the present invention includes the steps of: forming, on a surface of a substrate formed of a metal or alloy, an intermediate layer formed of a metal or alloy that is softer than the substrate; and forming a metal film on a surface of the intermediate layer by accelerating a powder material of a metal or alloy together with a gas heated to a temperature lower than the melting point of the powder material and spraying the powder material onto the intermediate layer while keeping the powder material in a solid phase.

Moreover, in the above-described method for manufacturing a lamination according to the present invention, the substrate is formed of stainless steel, and the intermediate layer is any one metal selected from silver, gold, aluminum, copper, tin, lead, and zinc.

Moreover, in the above-described method for manufacturing a lamination according to the present invention, the intermediate layer is formed by sputtering.

Moreover, in the above-described method for manufacturing a lamination according to the present invention, the metal film is deposited on the surface of the intermediate layer while the substrate on which the intermediate layer is formed is being heated at the forming of the metal film.

Advantageous Effects of Invention

For a lamination and a method for manufacturing a lamination according to the present invention, an intermediate layer formed of material softer than the metal substrate is formed on a metal substrate, and material powder is accelerated together with a gas heated to a temperature lower than the melting point of the material powder, and sprayed to be deposited on the intermediate layer while remaining in a solid phase to form a metal film, thereby achieving a lamination having high adhesion strength between the metal substrate and the metal film.

DESCRIPTION OF EMBODIMENTS

Figure 1:
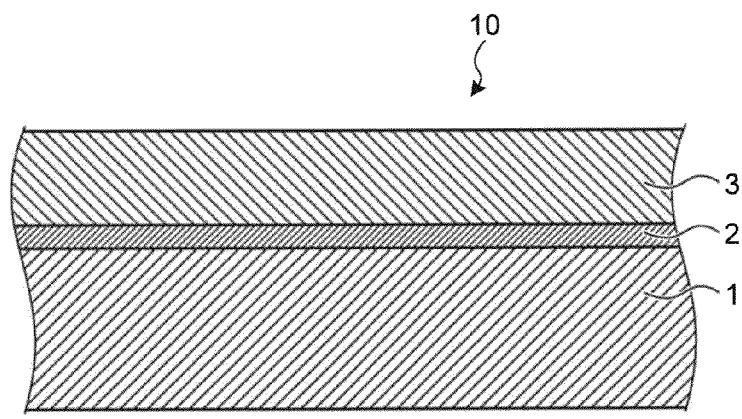
FIG. 1 is a schematic diagram illustrating the constitution of a lamination according to an embodiment of the present invention.

Described below in detail with reference to the drawings is a mode for carrying out the present invention. The present invention is not limited by the following embodiment. The drawings referred to in the following description illustrate the shape, size, and position relation just schematically enough to allow the details of the present invention to be understood. In other words, the present invention is not limited only to the shape, size, and position relation exemplified in the drawings.

Described first in detail with reference to the drawings is a method for manufacturing a lamination according to the embodiment of the present invention. FIG. 1 is a schematic diagram illustrating the constitution of a lamination according to the embodiment of the present invention.

This lamination 10 includes a substrate 1, an intermediate layer 2 formed on a surface of the substrate 1, and a metal film 3 stacked on the intermediate layer 2 by the cold spray method described below.

The substrate is formed of a metal or alloy and is formed in nearly a plate shape. Selected as the metal or alloy forming the substrate 1, hard metal or alloy in particular is effective, whose surface is hard to directly receive the metal film 3 stacked by a cold spray apparatus described below. Examples include stainless steel (a Vickers hardness of 200±20), molybdenum (a Vickers hardness of 250±20), tungsten (a Vickers hardness of 380±40), titanium alloy 64Ti (a Vickers hardness of 320±30), and carbon steel S45C (a Vickers hardness of 230±30) listed in Table 1 below. However, even in a case in which the substrate 1 is formed of a less hard metal or alloy, by forming the intermediate layer 2 having a lower hardness than that of the substrate 1 and forming the metal film 3 on the intermediate layer 2 by the cold spray apparatus, the metal film 3 can be stacked with a milder condition and the adhesion strength of the boundary surface between the substrate 1 and the metal film 3 can be increased. Some metals other than the metal or alloy listed in Table 1 below can be selected as the substrate 1.

In general, to form the metal film 3 by the cold spray method on the substrate 1 formed of a metal or alloy, the material powder to be the film impinges on the substrate 1 at high velocity. This causes plastic deformation between the material powder and the substrate 1, leading to bonding between the metal film 3 and the substrate 1 through the anchor effect and metallic bonds. However, as listed in Table 1, for example, because stainless steel (SUS) is hard with a hardness of 200±20 (Vickers hardness), plastic deformation hardly occurs between it and the sprayed material powder, leading to inability to achieve a lamination having high adhesion strength between the stainless substrate 1 and the metal film 3.

TABLE 1

| Material | Hardness [HV] |
|---|---|
| Lead | 5 to 6 |
| Tin | 20 to 30 |
| Aluminum | 30 ± 10 |
| Silver | 25 to 30 |
| Gold | 33 to 35 |
| Zinc | 30 to 60 |
| Copper | 100 ± 20 |
| Aluminum alloy A6061 | 105 ± 10 |
| Carbon steel SS400 | 120 ± 20 |
| Titanium | 140 ± 10 |
| SUS | 200 ± 20 |
| Carbon steel S45C | 230 ± 30 |
| Molybdenum | 250 ± 20 |
| Titanium alloy 64Ti | 320 ± 30 |
| Tungsten | 380 ± 40 |

Given this situation, in the embodiment of the present invention, the intermediate layer 2 is provided on the substrate 1 and has lower hardness than that of the metal or alloy forming the substrate 1, and the metal film 3 is formed on the substrate 1 with the soft intermediate layer 2 interposed therebetween, thereby achieving a lamination having high adhesion strength between the substrate 1 and the metal film 3.

Table 1 lists principal metals and their alloys together with their Vickers hardnesses. The intermediate layer 2 is formed of one selected from among the metals or alloys having lower Vickers hardnesses than that of the metal or alloy forming the substrate 1. When stainless steel is used as the substrate 1, the intermediate layer 2 may be formed of a metal or its alloy having a lower Vickers hardness than stainless steel, that is, for example, titanium or copper.

With regard to the metal used as the intermediate layer 2, any metal having lower hardness than that of the metal or alloy selected as the substrate 1 may be selected in addition to the metals and alloys listed in Table 1. When the metal having lower hardness than that of the metal or alloy selected as the substrate 1 is selected as the intermediate layer 2, plastic deformation is likely to occur between it and the sprayed material powder, therefore improving the adhesion strength between the substrate 1 and the metal film 3. The intermediate layer 2 is preferably selected from any one metal selected from silver, gold, aluminum, copper, tin, lead, and zinc, which have low Vickers hardness. The intermediate layer 2 may be formed on the surface of the substrate 1 by plating, sputtering, or CVD. When the hardness of the metal or alloy forming the metal film 3 is lower than that of the substrate 1, the intermediate layer 2 is preferably formed of the same metal or alloy as the material selectable as the metal film 3.

The intermediate layer 2 preferably has a thickness of 0.05 μm or more and 10 μm or less. The reasons for this are as follows: A thickness of less than 0.05 μm cannot increase the adhesion strength between the substrate 1 and the metal film 3 even with the intermediate layer 2 formed therebetween. Increasing the thickness beyond 10 μm does not further improve the adhesion strength between the substrate 1 and the metal film 3. Furthermore, an influence on the functional aspect of the lamination 10 is caused by the excessively thickened intermediate layer 2.

The intermediate layer 2, which can be formed by plating, sputtering, or CVD as described above, is preferably formed by sputtering. Forming the intermediate layer 2 by sputtering can improve the adhesion strength between the intermediate layer 2 and the substrate 1, because an oxide film of the substrate 1 is removed to expose a nascent surface. When the intermediate layer 2 is formed to be extremely thin, the metal film 3 may break through the intermediate layer 2 and be directly formed on the surface of the substrate 1. In such a case, the anchor effect caused by the plastic deformation between the intermediate layer 2 and the material powder forming the metal film 3 decreases, whereas the material powder becomes likely to form metallic bonds with the nascent surface from which the oxide film is removed when the intermediate layer 2 is formed by sputtering. This can form the lamination 10 having high adhesion strength.

The metal film 3 may be selected from among desired metals or alloys, and examples of them include metals including silver, gold, aluminum, copper, tin, lead, zinc, iron, nickel, titanium, magnesium, indium, molybdenum, and tungsten and alloys containing any of the above-described metals.

Figure 2:
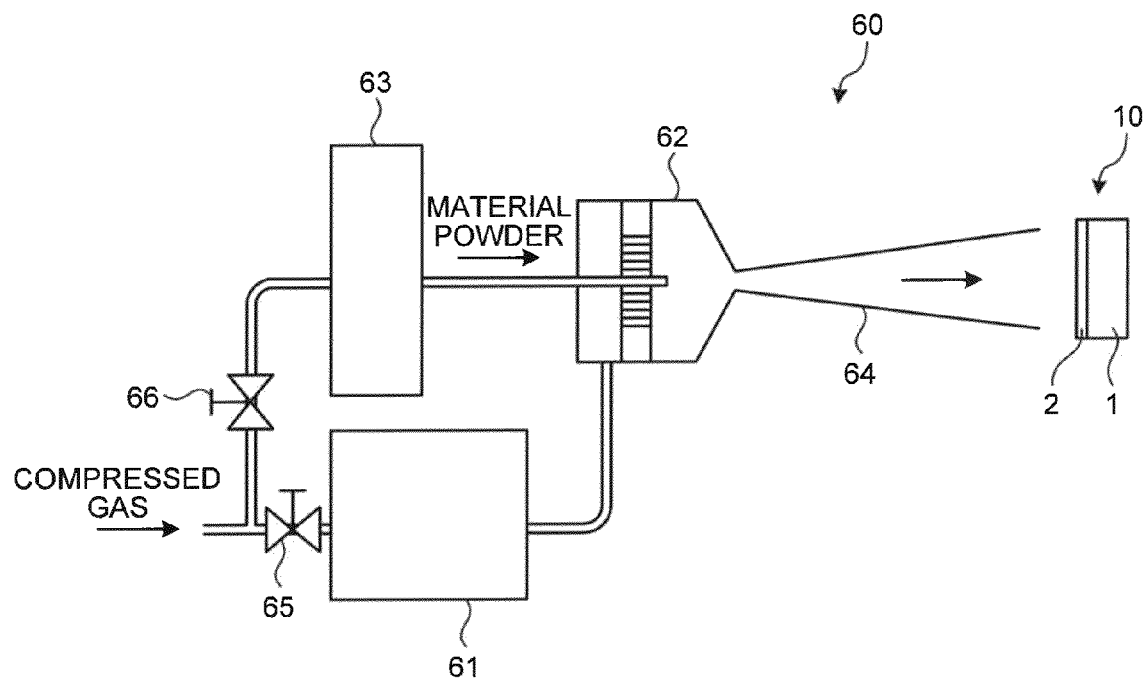
FIG. 2 is a schematic diagram illustrating the overview of a cold spray apparatus for use in the manufacture of the lamination according to the embodiment of the present invention.

Described next with reference to FIG. 2 is the formation of the metal film 3 on the surface of the substrate 1 with the intermediate layer 2 interposed therebetween. FIG. 2 is a schematic diagram illustrating the overview of a cold spray apparatus 60 for use in the formation of the metal film 3.

The cold spray apparatus 60 includes a gas heater 61 that heats a compressed gas, a powder supply apparatus 63 that houses the material powder to be sprayed onto the substrate 1 and supplies it to a spray gun 62, and a gas nozzle 64 through which the material powder mixed with the compressed gas heated by the spray gun 62 is sprayed onto the substrate 1.

As the compressed gas, helium, nitrogen, air, or the like is used. The supplied compressed gas is supplied to the gas heater 61 and the powder supply apparatus 63 through valves 65 and 66, respectively. The compressed gas supplied to the gas heater 61 is heated to a temperature of, for example, 50° C. or more and not more than the melting point of the material powder of the metal film 3, and then supplied to the spray gun 62. The heating temperature of the compressed gas is preferably 300 to 900° C.

The compressed gas supplied to the powder supply apparatus 63 supplies the material powder having a particle diameter of, for example, 10 to 100 μm within the powder supply apparatus 63 to the spray gun 62 so as to give a certain discharge amount. The heated compressed gas is made into a supersonic flow (about 340 m/s or more) through the gas nozzle 64 having a convergent-divergent shape. The pressure of the compressed gas is preferably about 1 to 5 MPa. Setting the pressure of the compressed gas to about 1 to 5 MPa improves the adhesion strength between the substrate 1 and the metal film 3. The processing is preferably performed under a pressure of 2 to 4 MPa. The material powder supplied to the spray gun 62 is accelerated through introduction into the supersonic flow of the compressed gas to impinge on the substrate at high velocity while remaining in a solid phase to form a film. The apparatus is not limited to the cold spray apparatus 60 in FIG. 2, so long as it can form a film by causing the material powder to impinge on the substrate 1 in a solid phase.

The intermediate layer 2 formed of a material having lower hardness than that of the substrate 1 is formed on the substrate 1, and the metal film 3 is formed on the substrate 1 with the intermediate layer 2 interposed therebetween. The metal film 3 is formed by accelerating the material powder together with a gas and spraying to deposit the material powder on the intermediate layer 2 while keeping the material powder in a solid phase through the above cold spray apparatus 60. This improves the adhesion strength between the substrate 1 and the metal film 3.

As a modification to the embodiment of the present invention, a lamination 10A can be exemplified in which, to form the metal film 3 on the substrate 1 with the intermediate layer 2 interposed therebetween, the powder material in a solid phase is sprayed together with a heated gas and deposited on the intermediate layer 2 while the substrate 1 is being heated. The lamination 10A in which the metal film 3 is formed while the substrate 1 is being heated further improves the adhesion strength between the substrate 1 and the metal film 3. The heating temperature of the substrate 1 is preferably 100° C. to 300° C. The heating of the substrate 1 may be heated using a heater that uniformly heats the entire substrate 1 to a predetermined temperature.

EXAMPLES

Experimental Example 1

A stainless test piece of 5 square cm, copper, and copper were selected as the substrate 1, the intermediate layer 2, and the metal film 3, respectively. The copper intermediate layer 2 with a thickness of 2 μm was formed on a surface of the stainless test piece as the substrate 1 by sputtering. The metal film 3 with a width of 8 mm was formed on the intermediate layer 2 in a horizontal stripes manner by the cold spray apparatus 60. On the test piece, metal films 3a, 3b, and 3c were stacked with the pressure of the compressed gas changed successively (Example 1, compressed gas: nitrogen, compressed gas temperature: 600° C., gas pressure: 3, 4, and 5 MPa in ascending order).

As Comparative Example 1, a stainless test piece of 5 square cm and copper were selected as the substrate 1 and the metal film 3, respectively, and no intermediate layer 2. The metal film 3 with a width of 8 mm was stacked on a surface of the stainless test piece as the substrate 1 in a horizontal stripes manner by the cold spray apparatus 60. On the test piece, the metal films 3a', 3b', and 3c' were stacked with the pressure of the compressed gas changed successively (Comparative Example 1, compressed gas: nitrogen, compressed gas temperature: 600° C., gas pressure: 3, 4, and 5 MPa in ascending order).

Figure 3:
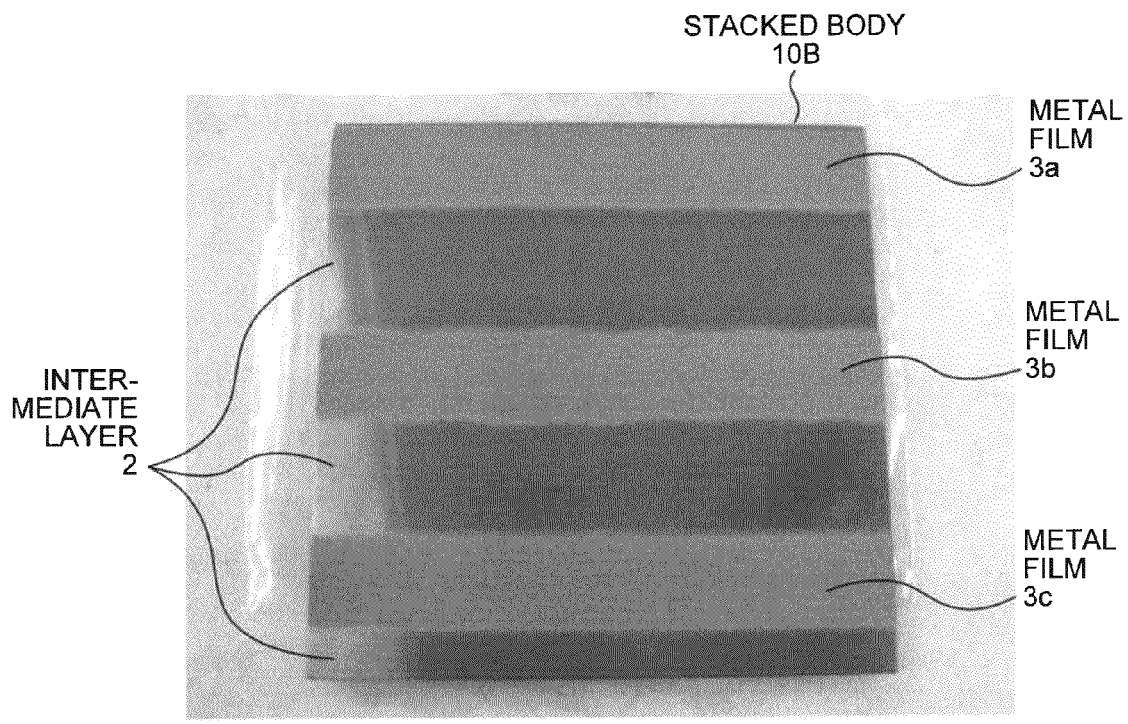
FIG. 3 is a picture illustrating the appearance of the lamination according to the embodiment of the present invention.
Figure 4:
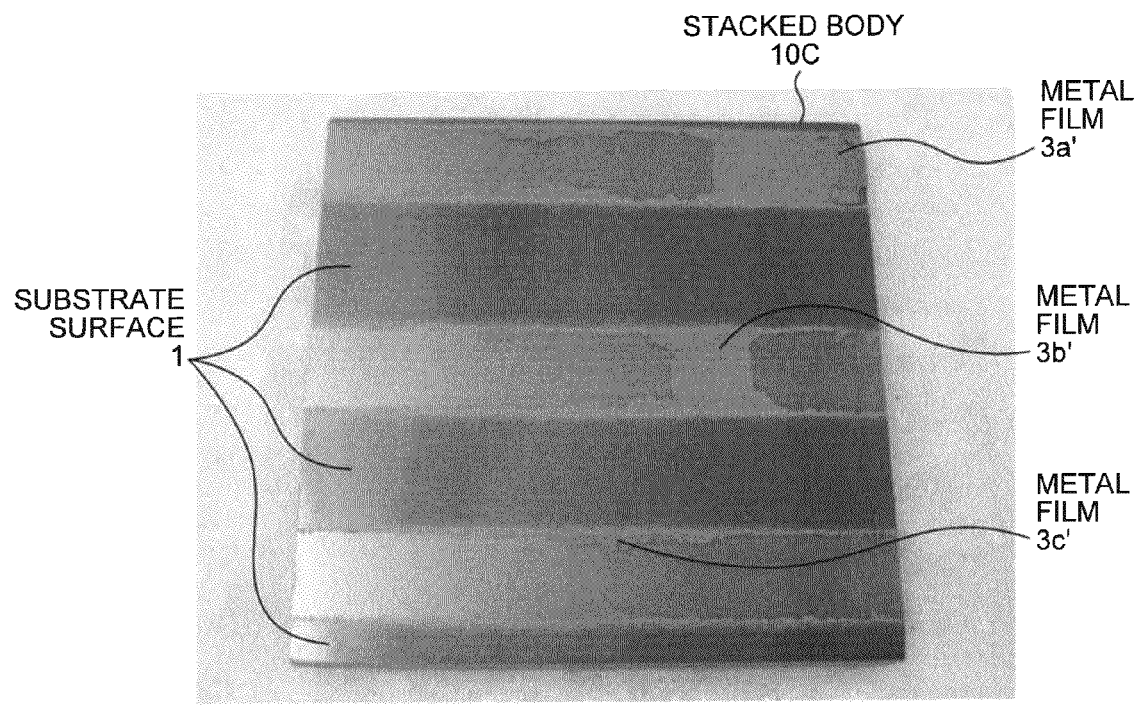
FIG. 4 is a picture illustrating the appearance of a lamination according to a comparative example.

FIG. 3 is a picture illustrating the appearance of a lamination 10B according to Example 1 of the present invention. FIG. 4 is a picture illustrating the appearance of a lamination 10C according to the comparative example.

In Comparative Example 1 in which the horizontal-stripes-shaped copper metal film 3 was stacked on the surface of the stainless substrate 1 by the cold spray apparatus 60 without the intermediate layer 2 formed, as illustrated in FIG. 4, in the metal film 3a' with a compressed gas pressure of 5 MPa, a film was stacked in a somewhat more amount as compared to the metal film 3b' with that of 4 MPa and the metal film 3c' with that of 3 MPa. The copper powder material was, however, not sufficiently deposited on the surface of the stainless substrate 1 in any pressure conditions, and thus the metal film 3 (3a' to 3c') was not formed. In contrast, in Example 1, as illustrated in FIG. 3, the copper powder material was deposited on the surface of the stainless substrate 1 through the intermediate layer 2 to stack the horizontal-stripes-shaped copper metal film 3 in any conditions of the metal film 3a with a compressed gas pressure of 5 MPa, the metal film 3b with that of 4 MPa, and the metal film 3c with that of 3 MPa.

Experimental Example 2

As is the case in Experimental Example 1, a stainless test piece of 5 square cm, copper, and copper were selected as the substrate 1, the intermediate layer 2, and the metal film 3, respectively. On the substrate 1 on which the copper intermediate layer 2 with a thickness of 2 μm was formed by sputtering, the copper metal film 3 was stacked on the surface of the intermediate layer 2 opposite its surface in contact with the stainless substrate 1 (Example 2, compressed gas: nitrogen, compressed gas temperature: 600° C., gas pressure: 4 MPa) to form the lamination 10. While the substrate 1 made of stainless steel is being heated, the copper metal film 3 was formed on the surface of the intermediate layer 2 opposite its surface in contact with the substrate 1 to form the lamination 10 (Examples 3 and 4, compressed gas: nitrogen, compressed gas temperature: 600° C., gas pressure: 4 MPa).

As a comparative example, a lamination was manufactured in which the copper metal film 3 was stacked on the surface of the substrate 1 formed of stainless steel by the cold spray apparatus 60 and no intermediate layer 2 was formed (Comparative Example 2, compressed gas: nitrogen, compressed gas temperature: 600° C., gas pressure: 4 MPa). Stacked bodies were also manufactured in which, while the substrate 1 made of stainless steel is being heated, the copper metal film 3 was formed on the surface of the substrate 1 (Comparative Examples 3 and 4, compressed gas: nitrogen, compressed gas temperature: 600° C., gas pressure: 4 MPa).

Figure 5:
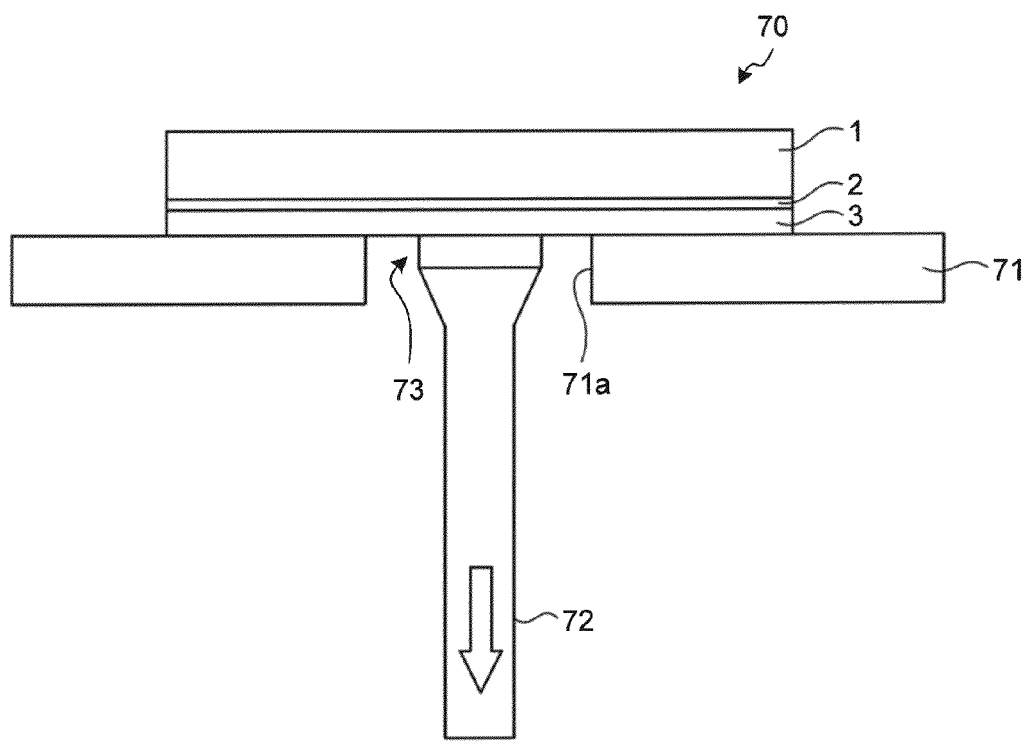
FIG. 5 is a diagram illustrating the schematic diagram of a test based on a simple tensile test method.

For the test pieces of the stacked bodies prepared as described above, the adhesion strength between the substrate 1 and the metal film 3 was evaluated by a tensile strength test method. FIG. 5 illustrates the schematic diagram of a test by a simple tensile test method applied in the present examples. In this method, an aluminum pin 72 was bonded, through an adhesive 73, to the metal film 3 (Examples 2 to 4) formed on the substrate 1 with the intermediate layer 2 interposed therebetween and to the metal film 3 (Comparative Examples 2 to 4) formed directly on the substrate 1. The aluminum pin 72 bonded to the metal film 3 through the adhesive 73 was inserted into a hole 71a of a fixing stage 71 from above and pulled downward, thereby evaluating the adhesive strength between the stainless substrate 1 and the metal film 3. The evaluation was performed based on the tensile stress and the peeled state when the bonding was peeled. Table 2 below lists the heating conditions of the substrate 1 and the evaluation results of the tensile test.

TABLE 2

|  | Substrate heating temperature | Tensile strength test |
| --- | --- | --- |
| Example 2 | Room temperature (no heating) | ○ |
| Example 3 | 200° C. | ○ |
| Example 4 | 300° C. | ○ |
| Comparative Example 2 | Room temperature (no heating) | X |
| Comparative Example 3 | 200° C. | X |
| Comparative Example 4 | 300° C. | ○ |

In the evaluation results of the tensile test listed in Table 2, the symbol ○ in the "tensile test" column means that peeling caused by the breakage of the adhesive occurred on a predetermined maximum tensile stress (74 MPa). The symbol X in the "tensile test" column means that peeling occurred at the boundary surface between the substrate 1 and the metal film 3 on less than the predetermined maximum tensile stress (74 MPa). The thickness of the metal film 3 formed on the substrate 1 was about 100 μm.

As listed in Table 2, in Comparative Example 2 in which the copper metal film 3 was formed by the cold spray apparatus 60 without heating applied to the substrate 1 made of stainless steel on which no intermediate layer 2 is formed, peeling occurred at the boundary surface between the substrate 1 and the metal film 3. In contrast, in Example 2 in which the copper metal film 3 was formed on the substrate 1 with the intermediate layer 2 interposed therebetween by the cold spray apparatus 60, no boundary surface breakage was observed between the substrate 1 and the metal film 3, revealing improved adhesion strength between the substrate 1 and the metal film 3.

The lamination according to the embodiment of the present invention has the intermediate layer 2 formed of a metal or alloy that is softer than the substrate 1 formed of a metal or alloy on a surface of the substrate 1, and has the metal film 3 stacked through the intermediate layer 2 by the cold spray apparatus 60, thereby improving the adhesion strength of the boundary surface between the substrate 1 and the metal film 3.

INDUSTRIAL APPLICABILITY

As described above, the lamination and the method for manufacturing the lamination according to the present invention are useful when a metal film is stacked on a high hardness substrate by the cold spray method.

REFERENCE SIGNS LIST

1 Substrate
2 Intermediate layer
3 Metal film
10, 10A, 10B, 10C Lamination
60 Cold spray apparatus
61 Gas heater
62 Spray gun
63 Powder supply apparatus
64 Gas nozzle
70 Tensile test apparatus
71 Fixing stage
71a Hole
72 Aluminum pin
73 Adhesive

The invention claimed is:

1. A lamination, comprising:
a substrate formed of a metal or alloy;
an intermediate layer formed on a surface of the substrate and formed of a metal or alloy that is softer than the substrate; the intermediate layer having a thickness of 0.05 μm to 10 μm; and
a metal film deposited on a surface of the intermediate layer by accelerating a powder material of a metal or alloy together with a gas heated to a temperature lower than a melting point of the powder material and spraying the powder material onto the intermediate layer while keeping the powder material in a solid phase, a pressure of the gas being 1 MPa to 5 MPa,
wherein the powder material breaks through the intermediate layer and forms metallic bonds, with a nascent surface of the substrate.

2. The lamination according to claim 1, wherein
the substrate is formed of stainless steel, and
the intermediate layer is formed of any one metal selected from silver, gold, aluminum, copper, tin, lead, and zinc.

3. The lamination according to claim 1, wherein the metal film is formed of the same material as the intermediate layer.

4. The lamination according to claim 1, wherein the intermediate layer has a thickness of 0.05 μm to 10 μm.

5. The lamination according to claim 1, wherein the intermediate layer is formed by sputtering.

6. The lamination according to claim 1, wherein the metal film is deposited on the surface of the intermediate layer while the substrate on which the intermediate layer is formed is being heated to 100 to 300° C.

* * * * *